United States Patent [19]
Moore et al.

[11] Patent Number: 5,888,675
[45] Date of Patent: Mar. 30, 1999

[54] RETICLE THAT COMPENSATES FOR RADIATION-INDUCED LENS ERROR IN A PHOTOLITHOGRAPHIC SYSTEM

[75] Inventors: Bradley T. Moore; Robert Dawson; H. Jim Fulford, Jr., all of Austin; Mark I. Gardner, Cedar Creek; Frederick N. Hause, Austin; Mark W. Michael, Cedar Park; Derick J. Wristers, Austin, all of Tex.

[73] Assignee: Advanced Micro Devices, Inc., Sunnyvale, Calif.

[21] Appl. No.: 760,031

[22] Filed: Dec. 4, 1996

[51] Int. Cl.⁶ .................... G03F 9/00; G03C 5/00
[52] U.S. Cl. .................... 430/5; 430/30
[58] Field of Search ............................ 430/5, 30

[56] References Cited

U.S. PATENT DOCUMENTS

| | | | |
|---|---|---|---|
| 4,585,342 | 4/1986 | Lin et al. | 356/124 |
| 4,759,626 | 7/1988 | Kroko | 356/124 |
| 5,308,991 | 5/1994 | Kaplan | 250/492.22 |
| 5,329,334 | 7/1994 | Yim et al. | 355/53 |
| 5,402,224 | 3/1995 | Hirukawa et al. | 356/124 |
| 5,723,238 | 3/1998 | Moore et al. | 430/30 |

FOREIGN PATENT DOCUMENTS

| | | |
|---|---|---|
| 0307726 | 3/1989 | European Pat. Off. . |
| 0689099 | 12/1995 | European Pat. Off. . |
| 0724199 | 7/1996 | European Pat. Off. . |
| 1522285 | 8/1969 | Germany . |

*Primary Examiner*—Christopher G. Young
*Attorney, Agent, or Firm*—Skjerven, Morrill, MacPherson, Franklin & Friel, L.L.P.

[57] ABSTRACT

A reticle provides an image pattern and compensates for a lens error in a photolithographic system. The reticle is structurally modified using image displacement data indicative of the lens error. The reticle can be structurally modified by adjusting the configuration (or layout) of radiation-transmitting regions, for instance by adjusting a chrome pattern on the top surface of a quartz base. Alternatively, the reticle can be structurally modified by adjusting the curvature of the reticle, for instance by providing a chrome pattern on the top surface of a quartz base and grinding away portions of the bottom surface of the quartz base. The image displacement data may also vary as a function of lens heating so that the reticle compensates for lens heating associated with the reticle pattern.

26 Claims, 5 Drawing Sheets

FIG. 1
(PRIOR ART)

FIG. 2   LOW TEMPERATURE

FIG. 3   HIGH TEMPERATURE

RETICLE THAT COMPENSATES FOR RADIATION-INDUCED LENS ERROR IN A PHOTOLITHOGRAPHIC SYSTEM

BACKGROUND OF THE INVENTION

1. Field of the Invention

The present invention relates to reticles, and more particularly to reticles used in photolithographic systems used for fabricating integrated circuit devices.

2. Description of Related Art

Integrated circuit device fabrication requires that precisely controlled quantities be introduced into or deposited onto tiny regions of a wafer or substrate. Photolithography is typically used to create patterns that define these regions. That is, photoresist is spin-coated onto the wafer, selectively exposed to radiation, and then developed. If positive photoresist is used then the developer removes the irradiated regions, whereas if negative photoresist is used then the developer removes the non-irradiated regions. After the photoresist is patterned, the wafer is subjected to an additive process (such as ion implantation) or a subtractive process (such as etching) using the photoresist as a mask.

Photolithographic systems typically use a radiation source and a lens in conjunction with a mask or reticle to selectively irradiate the photoresist. The radiation source projects radiation through the mask or reticle to the lens, and the lens focuses an image of the mask or reticle onto the wafer. A mask transfers a pattern onto the entire wafer (or another mask) in a single exposure step, whereas a reticle transfers a pattern onto only a portion of the wafer. Step and repeat systems transfer multiple images of the reticle pattern over the entire wafer using multiple exposures. The reticle pattern is typically 2× to 10× the size of the image on the wafer, due to reduction by the lens. However, non-reduction (1×) steppers offer a larger field, thereby allowing more than one pattern to be printed at each exposure.

The reticle is typically composed of quartz with relatively defect-free surfaces and a high optical transmission at the radiation wavelength. Quartz has a low thermal expansion coefficient and high transmission for near and deep ultraviolet light. Although quartz tends to be expensive, it has become more affordable with the development of high quality synthetic quartz material.

The reticle is prepared by cutting a large quartz plate which is polished and cleaned, and then coated with a mask forming material such as chrome or iron oxide. Chrome is the most widely used material and is typically deposited by sputtering or evaporation to a thickness of less than 1,000 angstroms. The chrome is then selectively removed to form the pattern. For instance, a very thin layer of photoresist is deposited on the chrome and patterned (either optically or by an electron beam) by imaging and exposing a set of accurately positioned rectangles, and then a wet etch is applied. Patterning the reticle for a complex VLSI circuit level may require in excess of 100,000 rectangle exposures over a 10 hour period. During this period, extreme temperature control is often necessary to prevent positional errors. As a result, the quality of the reticle cannot be ascertained until after the chrome is etched.

Lens errors in step and repeat systems are highly undesirable since they disrupt the pattern transfer from the reticle to the photoresist, which in turn introduces flaws into the integrated circuit manufacturing process. Lens errors include a variety of optical aberrations, such as astigmatism and distortion. Astigmatism arises when the lens curvature is irregular. Distortion arises when the lens magnification varies with radial distance from the lens center. For instance, with positive or pincushion distortion, each image point is displaced radially outward from the center and the most distant image points are displaced outward the most. With negative or barrel distortion, each image point is displaced radially inward toward the center and the most distant image points are displaced inward the most. Accordingly, the lens error is frequently measured so that corrections or compensations can be made.

A typical technique for evaluating lens errors includes performing a photoresist exposure and development using specially designed mask patterns to be used for evaluation purposes. After such an imaging process, the wafer is either subjected to an optical inspection or is further processed to form electrically measurable patterns. The use of photosensitive detectors fabricated on silicon to monitor optical systems is also known in the art.

U.S. Pat. No. 4,585,342 discloses a silicon wafer with radiation sensitive detectors arranged in a matrix, an x-y stage for positioning the wafer so that each one of the detectors is separately disposed in sequence in the same location in the field of projected radiation, and a computer for recording the output signals of the detectors in order to calibrate the detectors prior to evaluating the performance of an optical lithographic system.

U.S. Pat. No. 5,402,224 provides distortion inspection of an optical system by providing a test reticle with a measurement pattern arranged at a predetermined interval Sx, transferring a the pattern from a test reticle to a photosensitive substrate, shifting the test reticle and the substrate relative to one another by ΔTx (where ΔTx<Sx), transferring measurement pattern again from the test reticle to the substrate, measuring the relative displacement between the two formed patterns to provide differential coefficients on distortion characteristics, and integrating the differential coefficients to provide the distortion characteristics.

Replacing the lens in a step and repeat system is considered impractical since the lens is a large, heavy, integral part of the system. Furthermore, it is unlikely that a substitute lens will render subsequent corrections unnecessary.

U.S. Pat. No. 5,308,991 describes predistorted reticles which incorporate compensating corrections for known lens distortions. Lens distortion data is obtained which represents the feature displacement on a wafer as a function of the field position of the lens. The lens distortion data is used to calculate x and y dimensional corrections terms. The inverted correction terms are multiplied by a stage controller's compensation value to correctly position the reticle. In this manner, the reticle is positioned to compensate for the lens error. A drawback to this approach, however, is that a highly accurate reticle positioning apparatus is required.

Accordingly, a need exists for an improved technique that compensates for lens errors in photolithographic systems.

SUMMARY OF THE INVENTION

An object of the invention is to provide compensation for lens errors. Another object is to improve the accuracy of photolithographic systems such as step and repeat systems. The present invention achieves these objectives by providing a reticle that provides an image pattern and compensates for a lens error. In accordance with one aspect of the invention, a method of compensating for a lens error in a photolithographic system includes obtaining the lens error in terms of image displacement data, and structurally modifying a reticle using the image displacement data so that the reticle compensates for the lens error. Preferably, the image displacement data is a function of x and y coordinates on the lens surface.

The reticle can be structurally modified by adjusting the configuration (or layout) of radiation-transmitting regions on the reticle, for instance by adjusting a chrome pattern on the top surface of a quartz base. Alternatively, the reticle can be structurally modified by adjusting the curvature of the reticle, for instance by disposing a chrome pattern on the top surface of a quartz base and grinding away portions of the bottom surface of the quartz base.

In one embodiment, the image displacement data varies as a function of lens heating, and structurally modifying the reticle includes compensating for lens heating associated with the reticle pattern. Obtaining the image displacement data includes projecting a first amount of radiation through a first test pattern and the lens to provide a first lens error associated with a first heating of the lens, projecting a second amount of radiation through a second test pattern and the lens to provide a second lens error associated with a second heating of the lens, and using the first and second lens errors to provide the image displacement data. In this manner, the reticle can be structurally modified to compensate for localized heating effects in the lens that are associated with the reticle pattern.

Advantageously, the reticle can be adapted for patterning an integrated circuit device, in which case the reticle provides both an image pattern and compensation for the lens error in a photolithographic system during fabrication of an integrated circuit device.

These and other objects, features and advantages of the invention will be further described and more readily apparent from a review of the detailed description of the preferred embodiments which follow.

BRIEF DESCRIPTION OF THE DRAWINGS

The following detailed description of the preferred embodiments can best be understood when read in conjunction with the following drawings, in which.

DETAILED DESCRIPTION OF THE PREFERRED EMBODIMENTS

In the drawings, depicted elements are not necessarily drawn to scale and like or similar elements may be designated by the same reference numeral throughout the several views.

Figure 1:
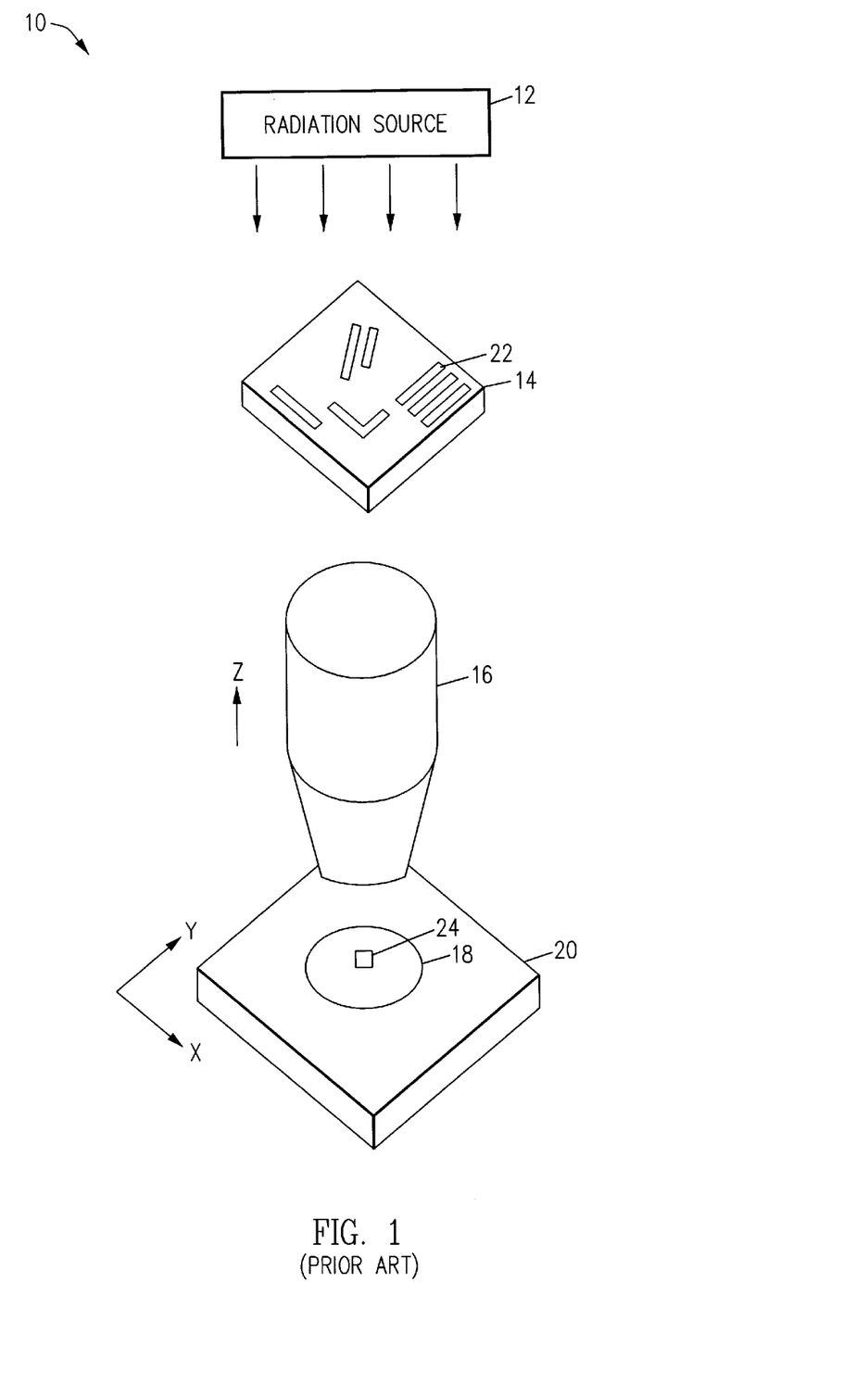
FIG. 1 is a perspective view showing a typical arrangement of a step and repeat system.

FIG. 1 is a perspective view showing a typical arrangement of a step and repeat system for fabricating integrated circuit devices. System 10 includes radiation source 12, reticle 14, lens 16, and wafer 18 mounted on x-y stepping table 20. Radiation source 12 includes a mercury-vapor lamp for generating I-line ultraviolet light. Reticle 14 includes a chrome pattern on a quartz base, with optically transparent lines 22 between regions of chrome for transferring a radiation pattern. Lens 16 focuses the radiation pattern onto portion 24 of photoresist-coated wafer 18. A computer (not shown), which is a standard digital data processor, controls the motion of stepping table 20 in the x-y direction for step and repeat operation, and the motion of lens 16 in the z direction for focusing the radiation pattern. Mechanisms to move the reticle, lens, and wafer in the x, y or z directions in response to electrical control signals are well-known in the art.

Figure 2:
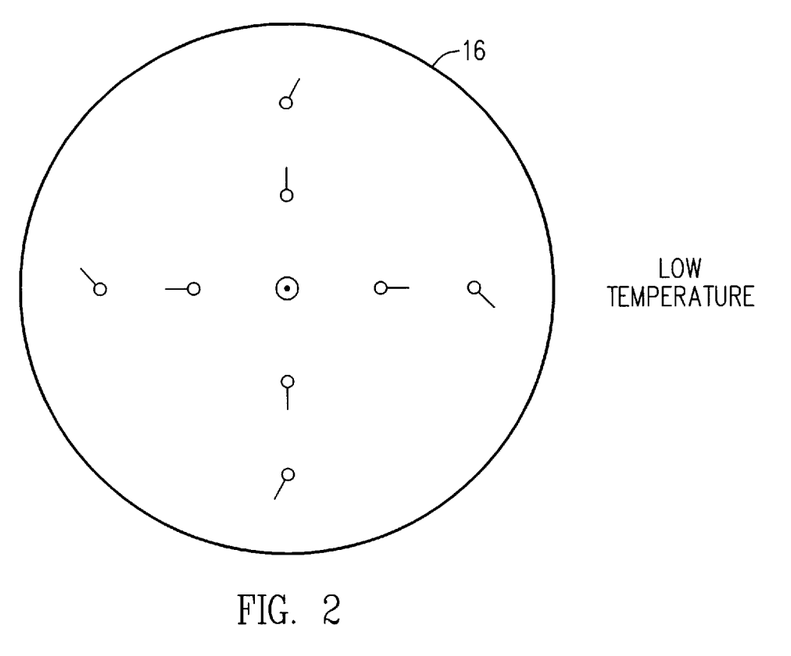
FIGS. 2 and 3 are pictorial representations of lens errors from different amounts of lens heating.
Figure 3:
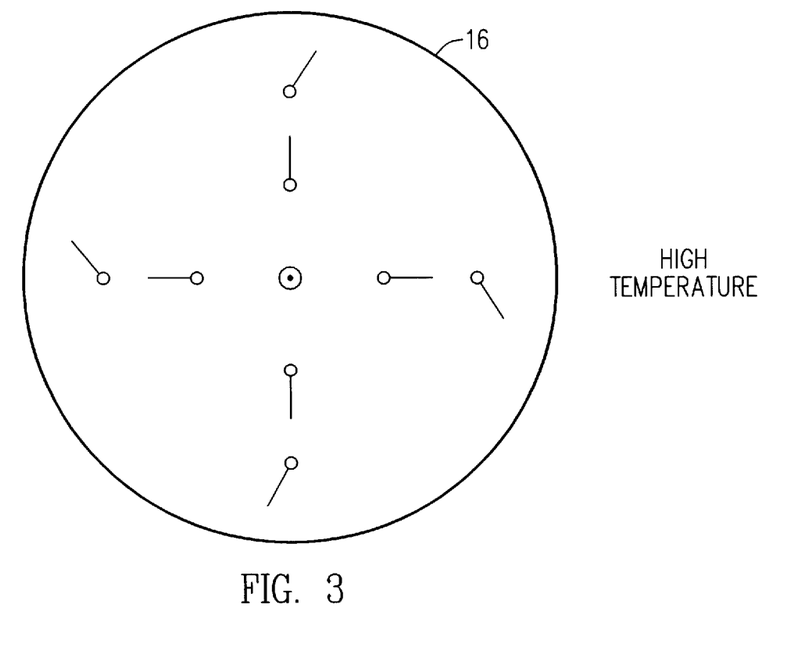

FIGS. 2 and 3 are pictorial representations of lens errors in lens 16 for varying amounts of lens heating. The small circles represent points (defined by x and y coordinates) on the bottom lens surface through which radiation passes. The lines associated with the circles represent the lens error at that point on the lens surface. The length of the line corresponds to the magnitude of the error, while the direction of the line corresponds to the direction in which the image is displaced. FIG. 2 represents the lens error for lens 16 at a low temperature, whereas FIG. 3 represents the lens error for lens 16 at a high temperature. As is seen, the lens error is a function of the lens heating.

Figure 4:
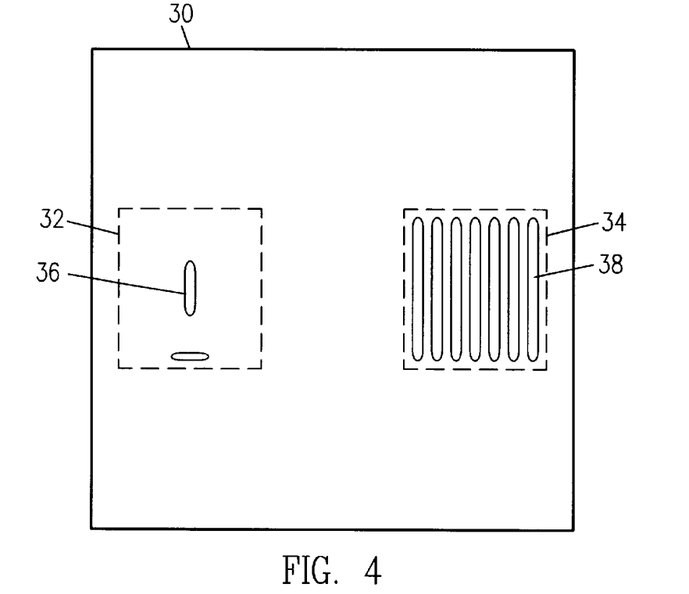
FIG. 4 is a top plan view of a reticle used for patterning an integrated circuit device.

FIG. 4 is a pictorial representation of a reticle used for patterning a layer of an integrated circuit device. Reticle 30 includes a first portion 32 with an isolated pattern of optically transparent lines, and a second portion 34 with a dense pattern of optically transparent lines. For instance, first portion 32 includes line 36, and second portion 34 includes line 38. The lines in first portion 32 are widely spaced from adjacent lines, whereas the lines in portion 34 are in close proximity to adjacent lines. The lines have a similar line width, for instance corresponding to the minimum resolution of system 10. Thus, second portion 34 transfers a far greater amount of radiation than first portion 32.

Figure 5:
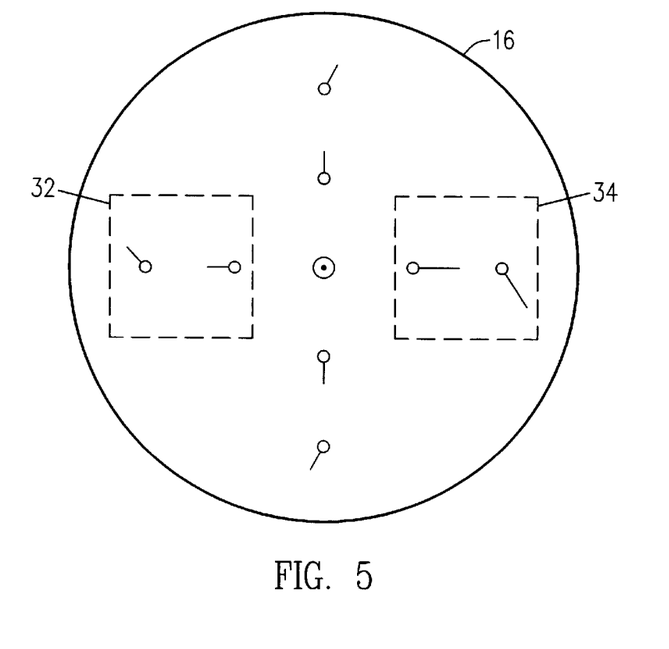
FIG. 5 is a pictorial representation of the lens error associated with the reticle of FIG. 4.

FIG. 5 is a pictorial representation of the lens error in lens 16 when reticle 30 is used. As is seen, the portion of lens 16 aligned with portion 32 of reticle 30 undergoes little localized heating and therefore corresponds to the lens error of FIG. 3, whereas the portion of lens 16 aligned with portion 34 of reticle 30 undergoes extreme localized heating and therefore corresponds to the lens error of FIG. 4. The portions of lens 16 outside portions 32 and 34 of reticle 30, which receive little or no localized heating, also correspond to the lens error of FIG. 3. Thus, the lens error for lens 16 is a function of localized lens heating that depends on the reticle pattern employed.

A lens error for lens 16 can be inspected independently of the reticle by using conventional techniques without attempting to characterize variations in the lens error as a function of lens heating. However, reticles often have unique patterns that expose some lens portions to far more radiation than others. Since the radiation has high intensity and the lens has low thermal conductivity, a portion of the lens subjected to a large amount of radiation is likely to get far hotter than a portion of the lens subjected to little or no radiation. Therefore, the particular reticle dictates the pattern of localized lens heating. Furthermore, since the lens has a given thermal coefficient of expansion, the lens dimensions change as a function of lens heat. Accordingly, the lens error arises not only from inherent lens flaws, but also from lens heating. Moreover, the lens error associated with lens heating depends on the specific reticle pattern.

Inspecting a lens error associated with reticle 30, or other reticles used for fabricating integrated circuit devices, can be pursued by measuring a transfer pattern for the reticle, comparing the transfer pattern with the reticle pattern, and then calculating the lens error for the reticle. In this manner, the lens error includes lens heating associated with the reticle. A drawback to this approach, however, is that the reticle pattern is normally not designed to facilitate inspecting the lens. For instance, a reticle pattern with long lines running predominantly in one direction may provide very limited information about image displacement in the direction of the lines. Furthermore, the reticle pattern may be difficult to measure at the desired coordinates.

The preferred approach for characterizing the lens error is set forth in U.S. Pat. No. 5,723,238, issued Mar. 3, 1998, assigned to the assignee of the present application, filed concurrently herewith, entitled "Inspection Of Lens Error Associated With Lens Heating In A Photolithographic System" by B. Moore et al., which is incorporated herein by reference. This approach includes projecting a first amount of radiation through a first test pattern and the lens to provide a first lens error associated with a first heating of the lens, projecting a second amount of radiation through a second test pattern and the lens to provide a second lens error associated with a second heating of the lens, and using the first and second lens errors to provide image displacement data that varies as a function of lens heating. In this manner, the image displacement data includes first data items corresponding to a first heating of the lens and second data items corresponding a second heating of the lens for each coordinate point on the lens surface. In one embodiment, obtaining the image displacement data includes forming a first image pattern on a first portion of photoresist on a wafer by projecting the radiation through a first test reticle and the lens such that the first test reticle transfers a first amount of radiation to the lens thereby providing the first heating of the lens, forming a second image pattern on a second portion of the photoresist by projecting radiation through a second test reticle and the lens such that the second test reticle transfers a second amount of radiation to the lens thereby providing the second heating of the lens, such that the second amount of radiation is substantially greater than the first amount of radiation resulting in the second heating of the lens being substantially greater than the first heating of the lens, developing the photoresist to selectively expose the wafer, etching the wafer using the photoresist as an etch mask thereby forming a first transfer pattern in the wafer corresponding to the first image pattern and a second transfer pattern in the wafer corresponding to the second image pattern, stripping the photoresist, obtaining the first data items by comparing a displacement between the first test pattern and the first transfer pattern, and obtaining the second data items by comparing a displacement between the second test pattern and the second transfer pattern.

Accordingly, it is necessary to obtain a lens error in some manner before the reticle of the present invention is modified. Preferably, the lens error is expressed in terms of image displacement data which provides the image displacement or offset as a function of position on the lens (or exposure field). The lens position can be defined, for instance, as a radial distance from the center of the lens, or as (x,y) coordinates on the lens surface. If the lens position is a radial distance, then the image displacement ($\Delta r$) is a function of radial distance. Likewise, if the lens position is in (x,y) coordinates, then the image displacement ($\Delta x$, $\Delta y$) is a function of the (x,y) coordinates. If several lens errors are obtained as a function of lens heating, then for each coordinate position on the lens surface, the image displacement data includes a first image displacement corresponding to the first lens heating, and a second image displacement corresponding to the second lens heating.

Furthermore, the image displacement data from the first and second lens errors can be interpolated or extrapolated as necessary. For instance, as a first approximation, one may assume a linear variation in lens error as a function of lens heating. Likewise, additional lens errors can be obtained, particularly for separate layers on a wafer. If desired, multiple ones of the first and second transfer patterns can be measured, and these measurements can be evaluated using statistical analysis to determine the first and second lens errors. Statistical analysis may also be useful in evaluating the effects of residual heating (from previous exposures) on the lens errors. That is, since step and repeat exposures are often done rapidly, previous exposures may affect the lens heating and the lens errors. Statistical analysis for multiple exposures can be used, for instance, to provide image displacement data based on the lens heating from typical exposures, although the initial exposures may produce somewhat less lens heating.

The image displacement data can also be determined in conjunction with a focus-exposure matrix. For instance, once the focus-exposure matrix for the wafer (or another wafer) is obtained, the first and second lens errors can be obtained using the optimal focus and exposure parameters. Furthermore, the image displacement data may include corrective information about inherent lens errors, lens heating errors, variations in the photoresist, variations in the topography of the wafer, and other factors that contribute to lens errors.

By way of example, the image displacement data obtained from a first lens error associated with heating lens 16 to a low temperature would be suitable for modifying portion 32 of reticle 30, and the image displacement data obtained from a second lens error associated with heating lens 16 to a high temperature would be suitable for modifying portion 34 of reticle 30. That is, portion 32 can be modified using image displacement data indicative of a small amount of lens heating since portion 32 includes an isolated radiation-transmitting pattern that transmits only a small amount of radiation, whereas portion 34 can be modified using image displacement data indicative of a large amount of lens heating since portion 34 includes a dense radiation-transmitting pattern that transmits a large amount of radiation.

FIGS. 6–9 illustrate one approach for structurally modifying reticle 30 to compensate for the lens error of lens 16 that is associated with reticle 30. In FIGS. 6–9, reticle 130 is obtained by adjusting the configuration of the radiation-transmitting regions of reticle 30.

Figure 6:
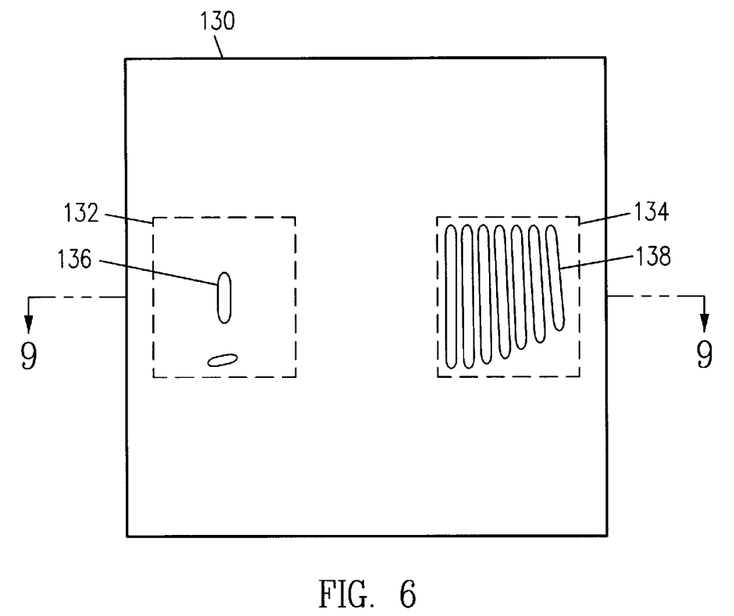
FIG. 6 is a top plan view of a reticle in accordance with an embodiment of the invention.

FIG. 6 is a top plan view of reticle 130, which includes first portion 132 containing an isolated pattern of optically transparent lines, and second portion 134 containing a dense pattern of optically transparent lines. For instance, first portion 132 includes line 136, and second portion 134 includes line 138. Reticle 130 is similar to reticle 30, except that in reticle 130 the configuration of the lines has been adjusted to compensate for the lens error associated with reticle 30. For instance, line 136 has been adjusted to compensate for the lens error associated with line 36, and line 138 has been adjusted to compensate for the lens error associated with line 38.

Figure 7:
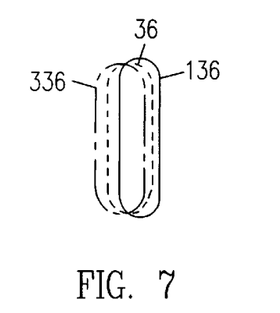
FIGS. 7 and 8 are enlarged views of portions of the reticle of FIG. 6 as compared to other patterns.

FIG. 7 is an enlarged view of line 136 compared to lines 36 and 336. Line 36 represents the ideal (aberration-free) transfer pattern. Line 336 represents the transfer pattern obtained using line 36. For convenience of explanation, lines 36, 136 and 336 are scaled to offset the intended lens reductions, and the displacements are exaggerated. The displacement between lines 36 and 336 is indicative of the lens error. Accordingly, line 136 is configured to compensate for this displacement. That is, when line 136 is used, the displacement between the ideal transfer pattern and the actual transfer pattern is reduced, thereby compensating for the lens error.

Figure 8:
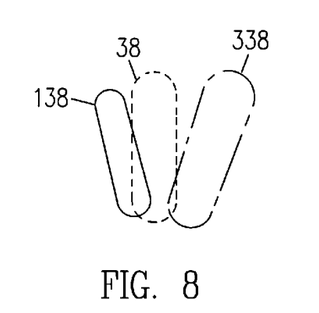

FIG. 8 is an enlarged view of line 138 compared to lines 38 and 338. Line 38 represents the ideal (aberration-free) transfer pattern. Line 338 represents the transfer pattern obtained using line 38. For convenience of explanation, lines 38, 138 and 338 are scaled to offset the intended lens reductions, and the displacements are exaggerated. The displacement between lines 38 and 338 is indicative of the lens error. Accordingly, line 138 is configured to compensate for this displacement. That is, when line 138 is used, the displacement between the ideal transfer pattern and the actual transfer pattern is reduced, thereby compensating for the lens error.

The displacement between lines 38 and 338 is substantially greater than the displacement between lines 36 and 336 since, for illustration purposes, the region of lens 16 associated with portion 134 receives substantially more localized heating than the region of lens 16 associated with portion 132. Advantageously, the first data items of the image displacement data are used to configure line 136, and the second data items of the image displacement data are used to configure line 138. Accordingly, the displacement between lines 36 and 136 is smaller than the displacement between lines 38 and 138. In this manner, reticle 130 is configured as a function of the lens error associated with reticle 30.

Figure 9:
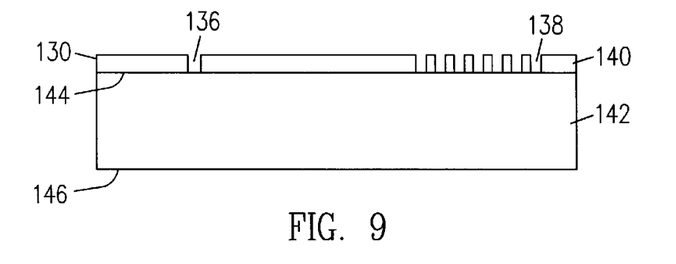
FIG. 9 is a cross-sectional view of the reticle of FIG. 6.

FIG. 9 is a cross-sectional view of reticle 130, which includes chrome pattern 140 on quartz base 142. Quartz base 142 includes top surface 144 and bottom surface 146. Surfaces 144 and 146 are planar. Accordingly, reticle 130 includes top and bottom opposing major surfaces. During fabrication of an integrated circuit device, radiation from radiation source 12 passes from the top major surface to the bottom major surface of reticle 130, and then to lens 16. Chrome pattern 140 provides a radiation-blocking pattern, and quartz base 142 provides a radiation-transmitting base. Chrome pattern 140 is configured to compensate for the lens error, and quartz base 142 is conventional.

FIGS. 10–13 illustrate another approach for structurally modifying reticle 30 to compensate for the lens error of lens 16 that is associated with reticle 30. In FIGS. 10–13, reticle 230 is obtained by adjusting a curvature of the bottom surface of reticle 30.

Figure 10:
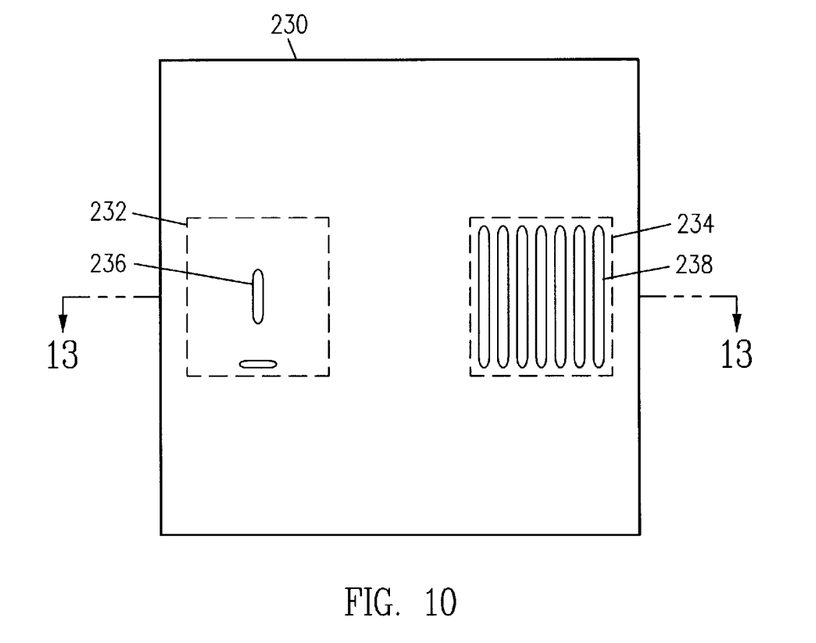
FIG. 10 is a top plan view of a reticle in accordance with another embodiment of the invention.

FIG. 10 is a top plan view of reticle 230, which includes first portion 232 containing an isolated pattern of optically transparent lines, and second portion 234 containing a dense pattern of optically transparent lines. For instance, first portion 232 includes line 236, and second portion 234 includes line 238. Reticle 230 is similar to reticle 30, except that the bottom surface of reticle 230 has been adjusted to compensate for the lens error associated with reticle 30. For instance, line 236 matches line 36, and line 238 matches line 38.

Figure 11:
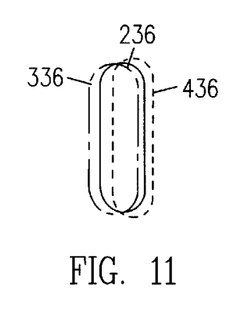
FIGS. 11 and 12 are enlarged views of portions of the reticle of FIG. 10 as compared to other patterns.

FIG. 11 is an enlarged view of line 236 compared to lines 336 and 436. Line 236 represents the ideal (aberration-free) transfer pattern. Line 336 represents the transfer pattern obtained using line 36 with reticle 30. Line 436 represents the transfer pattern associated with line 336 in the absence of lens error. For convenience of explanation, lines 236, 336 and 436 are scaled to offset the intended lens reductions, and the displacements are exaggerated. The displacement between lines 236 and 336 is indicative of the lens error. Accordingly, the bottom surface of reticle 230 is ground to provide a curvature or "prescription" that compensates for this displacement. That is, when the curved bottom surface of reticle 230 is used, the displacement between the ideal transfer pattern and the actual transfer pattern is reduced, thereby compensating for the lens error.

Figure 12:
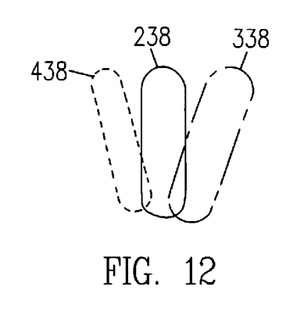

FIG. 12 is an enlarged view of line 238 compared to lines 338 and 438. Line 238 represents the ideal (aberration-free) transfer pattern. Line 338 represents the transfer pattern obtained using line 38 with reticle 30. Line 438 represents the transfer pattern associated with line 338 in the absence of lens error. For convenience of explanation, lines 238, 338 and 438 are scaled to offset the intended lens reductions, and the displacements are exaggerated. The displacement between lines 238 and 338 is indicative of the lens error. Accordingly, the bottom surface of reticle 230 is ground to provide a curvature that compensates for this displacement. That is, when the curved bottom surface of reticle 230 is used, the displacement between the ideal transfer pattern and the actual transfer pattern is reduced, thereby compensating for the lens error.

The displacement between lines 238 and 338 is substantially greater than the displacement between lines 236 and 336 since, for illustration purposes, the region of lens 16 associated with portion 234 receives substantially more localized heating than the region of lens 16 associated with portion 232. Advantageously, the first data items of the image displacement data are used to determine the curvature of the bottom surface of reticle 230 beneath portion 232, and the second data items of the image displacement data are used to determine the curvature of the bottom surface of reticle 230 beneath portion 234. Accordingly, the curvature of the bottom surface of reticle 230 is less beneath portion 232 than portion 234 since the displacement between lines 236 and 336 is smaller than the displacement between lines 238 and 338. In this manner, reticle 230 is configured as a function of the lens error associated with reticle 30.

Figure 13:
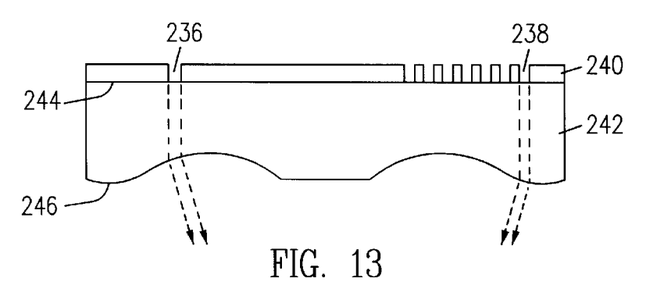
FIG. 13 is a cross-sectional view of the reticle of FIG. 10.

FIG. 13 is a cross-sectional view of reticle 230, which includes chrome pattern 240 on quartz base 242. Quartz base 242 includes top surface 244 and bottom surface 246. Top surface 244 is planar, but bottom surface 246 is curved, and thus selected portions of quartz base 242 are thicker than others. Accordingly, reticle 230 includes top and bottom opposing major surfaces. During fabrication of an integrated circuit device, radiation from radiation source 12 passes from the top major surface to the bottom major surface of reticle 230, and then to lens 16. Chrome pattern 240 provides a radiation-blocking pattern, and quartz base 242 provides a radiation-transmitting base. Chrome pattern 240 is unmodified with respect to the chrome pattern on reticle 30. However, the curvature of bottom surface 246 re-directs the radiation in order to compensate for the lens error. In effect, quartz base 242 provides an optical correction plate.

Thus, the present invention provides for structurally modifying a reticle, adapted for fabricating an integrated circuit device, in order to compensate for a lens error in a photolithographic system. For instance, the reticle specifications can be adjusted in accordance with the invention, and then provided to a reticle manufacturer for use in fabricating a structurally modified reticle. Preferably, the image displacement data is specific to a particular lens. It is also preferred that the reticle modification is based at least in part on the anticipated lens error associated with the original reticle. Advantageously, the modified reticle need not be re-positioned or re-aligned with respect to the original reticle position. That is, the modified reticle per se compensates for the lens error.

Variations to the above embodiments are apparent. For instance, structurally modifying the reticle can include varying the topography of at least one major surface of the reticle or, if desired, varying the topography of both major surfaces. For instance both the chrome pattern and the curvature of the bottom surface of the quartz base can be adjusted. The lens error can obtained using a variety of techniques, for instance by evaluating image patterns using various photosensitive materials (both positive and negative) or photosensitive detectors. If desired, a structurally modified mask can be used that patterns an entire wafer in a single exposure step. The invention is well-suited for reducing lens errors a variety of optical projection systems.

Those skilled in the art will readily implement the steps necessary to provide the structures and methods disclosed herein, and will understand that the process parameters, materials, dimensions, and sequence of steps are given by way of example only and can be varied to achieve the desired result as well as modifications which are within the scope of the invention. Variations and modifications of the embodiments disclosed herein may be made based on the description set forth herein, without departing from the spirit and scope of the invention as set forth in the following claims.

What is claimed is:

1. A method of compensating for a lens error of a lens in a photolithographic system, comprising:

obtaining the lens error in terms of image displacement data; and structurally modifying a reticle using the image displacement data so that the reticle compensates at least for the lens error resulting from localized lens heating associated with a radiation-transmitting pattern of the reticle.

2. The method of claim 1, wherein the image displacement data varies as a function of heating the lens.

3. The method of claim 1, wherein obtaining the image displacement data includes:

projecting a first amount of radiation through a first test pattern and the lens to provide a first lens error associated with a first heating of the lens;

projecting a second amount of radiation through a second test pattern and the lens to provide a second lens error associated with a second heating of the lens; and using the first and second lens errors to provide the image displacement data.

4. The method of claim 3, further including:

projecting radiation through the first test pattern to form a first image pattern in a first portion of photosensitive material on a wafer;

projecting radiation through the second test pattern to form a second image pattern in a second portion of the photosensitive material; developing the photosensitive material to expose selected portions of the wafer; and etching the wafer using the photosensitive material as an etch mask thereby forming a first transfer pattern in the wafer and a second transfer pattern in the wafer, wherein the first transfer pattern is associated with the first test pattern and the second transfer pattern is associated with the second test pattern.

5. The method of claim 1, wherein the reticle is adapted for patterning an integrated circuit device.

6. The method of claim 1, wherein the image displacement data is a function of position on the lens.

7. The method of claim 1, wherein the image displacement data is a function of x and y coordinates on a surface of the lens through which radiation passes.

8. The method of claim 1, wherein structurally modifying the reticle includes adjusting a configuration of radiation-transmitting regions of the reticle.

9. The method of claim 1, wherein structurally modifying the reticle includes adjusting a curvature of at least a portion of the reticle.

10. The method of claim 1, further including using the reticle to provide an image pattern and compensate for the lens error during fabrication of an integrated circuit device.

11. A method of compensating for a lens error of a lens in a photolithographic system used for fabricating integrated circuit devices, comprising:

obtaining the lens error in terms of image displacement data as a function of x and y coordinates on a surface of the lens;

structurally modifying a reticle using the image displacement data so that the reticle compensates at least for the lens error resulting from localized lens heating associated with a radiation-transmitting pattern of the reticle; and then projecting radiation through the reticle and the lens so that the reticle provides an image pattern and compensates for the lens error during fabrication of an integrated circuit device.

12. The method of claim 11, wherein structurally modifying the reticle includes adjusting a configuration of radiation-transmitting regions of the reticle.

13. The method of claim 12, wherein the reticle includes a radiation-blocking pattern on a radiation-transmitting base, and adjusting the configuration of the radiation-transmitting regions includes adjusting a configuration of the radiation-transmitting pattern with respect to the radiation-transmitting base.

14. The method of claim 13, wherein the radiation-blocking pattern includes chrome, and the radiation-transmitting base includes quartz.

15. The method of claim 11, wherein structurally modifying the reticle includes adjusting a curvature of at least a portion of the reticle.

16. The method of claim 15, wherein the reticle includes a radiation-blocking pattern on a radiation-transmitting base, and adjusting the curvature of the reticle includes adjusting a curvature of the radiation-transmitting base.

17. The method of claim 16, wherein the radiation-blocking pattern includes chrome, and the radiation-transmitting base includes quartz.

18. The method of claim 11, wherein the reticle includes first and second opposing major surfaces, the radiation passes from the first major surface to the second major surface, and structurally modifying the reticle includes adjusting a topography of at least one of the major surfaces.

19. The method of claim 18, wherein the first major surface includes a radiation-blocking pattern, and adjusting the topography includes adjusting a configuration of the radiation-blocking pattern.

20. The method of claim 18, wherein the second major surface is provided by a radiation-transmitting base, and adjusting the topography includes adjusting a curvature of the second major surface by grinding off portions of the second major surface.

21. The method of claim 11, wherein the reticle includes a chrome pattern disposed on a quartz base, and the photolithographic system is a step and repeat system.

22. The method of claim 11, further including:
   projecting the radiation through the reticle and the lens to form the image pattern in a photosensitive layer over the device;
   developing the photosensitive layer to selectively expose the device; and
   applying an etch to form a transfer pattern in the device that corresponds to the image pattern.

23. The method of claim 11, wherein the image displacement data includes multiple data items for each of the coordinates, and structurally modifying the reticle includes selecting a subset of the data items as a function of a radiation-transmitting pattern of the reticle.

24. The method of claim 11, wherein the image displacement includes first data items corresponding to a first heating of the lens, and second data items corresponding a second heating of the lens.

25. The method of claim 24, wherein obtaining the image displacement data includes:
   forming a first image pattern on a first portion of photoresist on a wafer by projecting the radiation through a first test reticle and the lens, wherein the first test reticle transfers a first amount of radiation to the lens thereby providing the first heating of the lens;
   forming a second image pattern on a second portion of the photoresist by projecting radiation through a second test reticle and the lens, wherein the second test reticle transfers a second amount of radiation to the lens thereby providing the second heating of the lens, and the second amount of radiation is substantially greater than the first amount of radiation resulting in the second heating of the lens being substantially greater than the first heating of the lens;
   developing the photoresist to selectively expose the wafer;
   etching the wafer using the photoresist as an etch mask, thereby forming a first transfer pattern in the wafer corresponding to the first image pattern, and a second transfer pattern in the wafer corresponding to the second image pattern;
   stripping the photoresist;
   obtaining the first data items by comparing a displacement between the first test pattern and the first transfer pattern; and
   obtaining the second data items by comparing a displacement between the second test pattern and the second transfer pattern.

26. In a photolithographic system including a lens with a lens error, a method of compensating for the lens error, comprising:
   expressing the lens error in terms of image displacement data;
   structurally modifying a reticle using the image displacement data wherein the reticle compensates at least for the lens error resulting from localized lens heating associated with a radiation-transmitting pattern; and then
   projecting radiation through the reticle and the lens so that the reticle forms an image pattern on an image plane and compensates for the lens error.

* * * * *